US006432833B1

(12) United States Patent
Ko

(10) Patent No.: US 6,432,833 B1
(45) Date of Patent: Aug. 13, 2002

(54) METHOD OF FORMING A SELF-ALIGNED CONTACT OPENING

(75) Inventor: Kei-Yu Ko, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/468,239

(22) Filed: Dec. 20, 1999

(51) Int. Cl.[7] .............................................. H01L 21/302

(52) U.S. Cl. .................... 438/714; 438/723; 438/729

(58) Field of Search ............................... 438/706, 714, 438/717, 719, 723, 729, 738, 743, 746

(56) References Cited

U.S. PATENT DOCUMENTS

| 4,753,709 | A |   | 6/1988  | Welch et al. ............... 156/643   |
|-----------|---|---|---------|---------------------------------------|
| 5,286,344 | A |   | 2/1994  | Blalock et al. ............ 156/657    |
| 5,298,465 | A |   | 3/1994  | Levy .......................... 437/225 |
| 5,366,590 | A | * | 11/1994 | Kadomura .................. 156/662    |
| 5,423,945 | A |   | 6/1995  | Marks et al. ............. 156/662.1   |
| 5,626,716 | A | * | 5/1997  | Bosch et al. ................ 438/723  |
| 5,677,227 | A |   | 10/1997 | Yang et al. ................... 437/60 |
| 5,685,914 | A |   | 11/1997 | Hills et al. ................. 118/723 |
| 5,780,338 | A |   | 7/1998  | Jeng et al. .................. 438/253 |
| 5,783,496 | A | * | 7/1998  | Flanner et al. ............... 216/67  |
| 6,074,488 | A | * | 6/2000  | Roderick et al. ........... 118/728    |
| 6,117,788 | A | * | 9/2000  | Ko ............................. 438/706 |
| 6,117,791 | A | * | 9/2000  | Ko et al. .................... 438/723 |
| 6,121,671 | A |   | 9/2000  | Ko et al. .................... 257/644 |
| 6,153,490 | A |   | 11/2000 | Xing et al. .................. 438/396 |
| 6,159,862 | A | * | 12/2000 | Yamada et al. ............. 438/712    |
| 6,165,880 | A |   | 12/2000 | Yaung et al. ................ 438/637  |
| 6,171,970 | B1 |  | 1/2001  | Xing et al. .................. 438/706 |
| 6,277,758 | B1 | * | 8/2001 | Ko ............................. 438/706 |

FOREIGN PATENT DOCUMENTS

| EP | 0 680 084 A1 | 4/1995 |
| WO | WO 98/49719 | 11/1998 |

OTHER PUBLICATIONS

M.D. Abatchev, et al., Study of the Boron–Phosphorous Doped and Undoped Silicate Glass Etcing In $CHF_3$/Ar Plasma; 96–12 Electrochemical Society Proceedings 522–530 (1996).

U.S. application Ser. No. 09/121,732, Kei–Yu Ko, Filed Mar. 3, 1998.

U.S. application Ser. No. 08/846,671, Kei–Yu Ko, filed Apr. 30, 1997.

U.S. patent application Ser. No. 09/861,047 Ko, et al., May 17, 2001.

* cited by examiner

Primary Examiner—Benjamin L. Utech
Assistant Examiner—Kin-Chan Chen
(74) Attorney, Agent, or Firm—Wells St. John P.S.

(57) ABSTRACT

A method includes placing a certain substrate within a high density plasma etcher. The etcher has a directly heatable top electrode having separately powerable inner and outer components, a biasable electrostatic chuck, and a directly heatable focus ring. Plasma etching is conducted through a mask on the substrate, using a hydrogen containing fluorocarbon chemistry, with power on both the top electrode components together totalling less than or equal to 1000 W per 200 mm of substrate diameter, with an electrostatic chuck bias power less than the total top electrode power, with the top electrode heated to greater than 100° C. and the focus ring heated to at least 200° C. Such etching is conducted into a doped oxide on the substrate substantially selective to insulating material on the substrate to form a substantially self-aligned contact opening to a substrate location beneath a doped silicon dioxide layer on the substrate. Other implementations are contemplated.

60 Claims, 4 Drawing Sheets

METHOD OF FORMING A SELF ALIGNED CONTACT OPENING

TECHNICAL FIELD

The invention relates to methods of forming self-aligned contact openings.

BACKGROUND OF THE INVENTION

Yield in the semiconductor fabrication industry is a measure of the percentage of operable chips produced in the fabrication of circuitry on a semiconductor wafer. Semiconductor fabricators are ever attempting to increase yield, and are sensitive to anything that decreases yield.

One aspect in semiconductor circuitry fabrication impacting yield is the plasma etching which is conducted to form self-aligned contact openings to substrate active area. Such etching is typically conducted through a doped silicon dioxide layer formed over active area and transistor gates which have their sides and tops covered with an insulating material other than doped silicon dioxide, for example silicon nitride. Plasma etching can be conducted which is substantially selective to silicon nitride and underlying silicon of the active areas, thereby being self-aligning with respect to a silicon nitride covered gate.

However, mask opening size or misalignment might result in the contact opening overlying a substrate isolation region which typically borders the active areas. These are commonly comprised of undoped silicon dioxide. It is problematic to achieve acceptable selectivity in etching doped silicon dioxide selectively relative to undoped silicon dioxide of the isolation regions. The literature supposedly reports several processes capable of achieving reasonably selective etches in such instances, yet satisfactory results are not always achieved which ultimately adversely affects yield. Undesired etching into the isolation oxide can adversely affect the circuitry, and thus destroy the product being produced where a contact opening inadvertently or desirably overlaps a substrate isolation region comprised principally of undoped silicon dioxide.

Accordingly, a need remains for improved methods of forming self-aligned contact openings to active areas where transistor gates are overlapped and substrate isolation regions of undoped oxide may or may not be exposed during the etch.

SUMMARY

The invention comprises a method of forming a self aligned contact opening. In one implementation, a bulk semiconductor substrate is provided which has an active area received between at least two undoped silicon dioxide comprising substrate isolation regions. The substrate has at least two transistor gate constructions received at least partially over the active area. The gate constructions include gates having their sides and tops covered with insulating material comprising at least one of undoped silicon dioxide and silicon nitride. A doped silicon dioxide layer is formed over the active area, the isolation regions and the gate constructions. A patterned masking layer is formed over the doped silicon dioxide layer. The patterned masking layer has a mask opening formed therein which overlaps at least one of the gate constructions and the active area. The substrate is placed within a high density plasma etcher. The etcher has a top power electrode and a biasable electrostatic chuck. Plasma etching is conducted through the mask opening, using a hydrogen containing fluorocarbon chemistry, a top electrode power less than or equal to 1000 W per 200 mm of substrate diameter, and an electrostatic chuck bias power less than the top electrode power by no more than 300 W, into the doped oxide substantially selective to the active area, insulating material and any overlapped area of the substrate isolation regions to form a substantially self aligned contact opening to the active area.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In the context of this document, "undoped" and "doped" with respect to silicon dioxide refers solely to boron and phosphorus doping of such oxide. Accordingly, such oxide may or may not be doped with other materials. In the context of this document, "doped silicon dioxide" refers to silicon dioxide having a dopant concentration of either phosphorus or boron which is greater than or equal to 3% by weight. The term "undoped silicon dioxide" is defined as silicon dioxide having a dopant concentration of less than 3% by weight of both boron and phosphorus considered separately. Accordingly by way of example only, a silicon dioxide layer having 2% boron and 2% phosphorus by weight is an "undoped silicon dioxide", whereas a silicon dioxide material having either a boron concentration or phosphorus concentration of at least 3% by weight is considered a "doped silicon dioxide".

Figure 1:
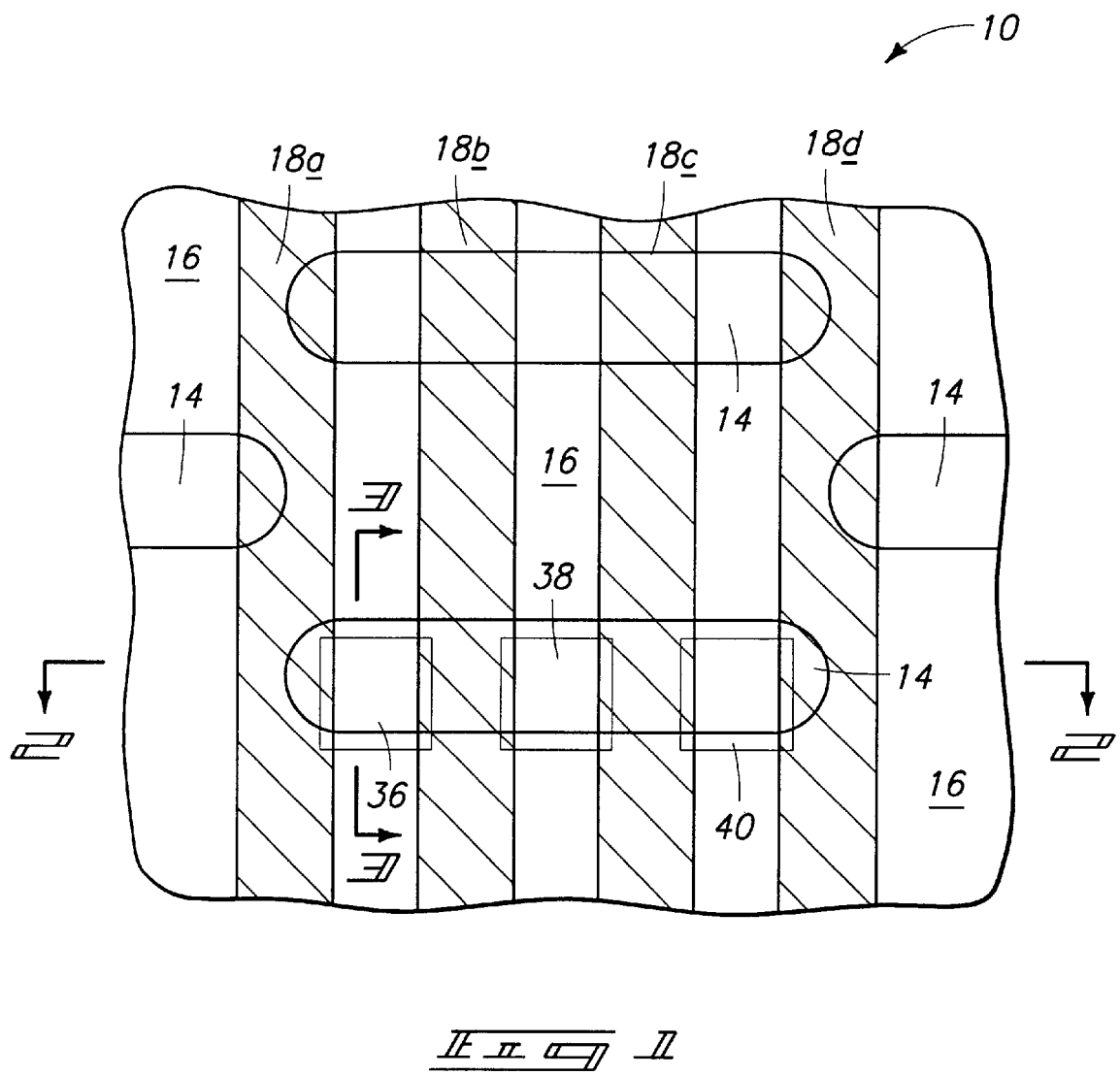
FIG. 1 is a diagrammatic top plan view of a semiconductor wafer fragment in process in accordance with an aspect of the invention.
Figure 2:
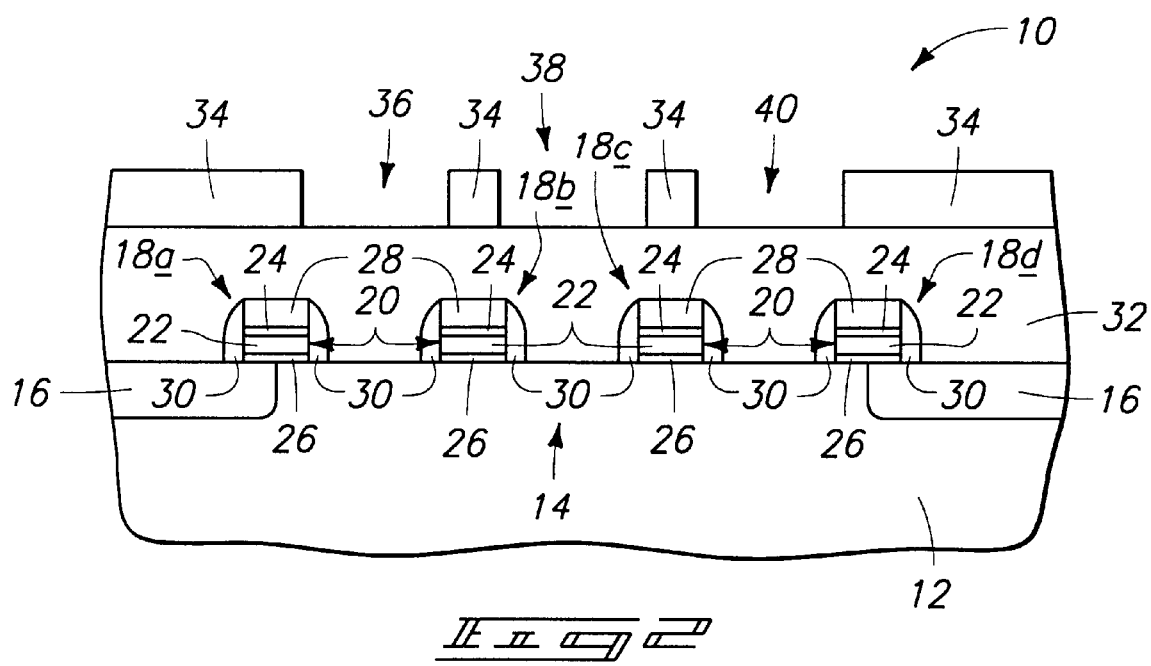
FIG. 2. is a cross-sectional view taken through line 2—2 in FIG. 1.
Figure 3:
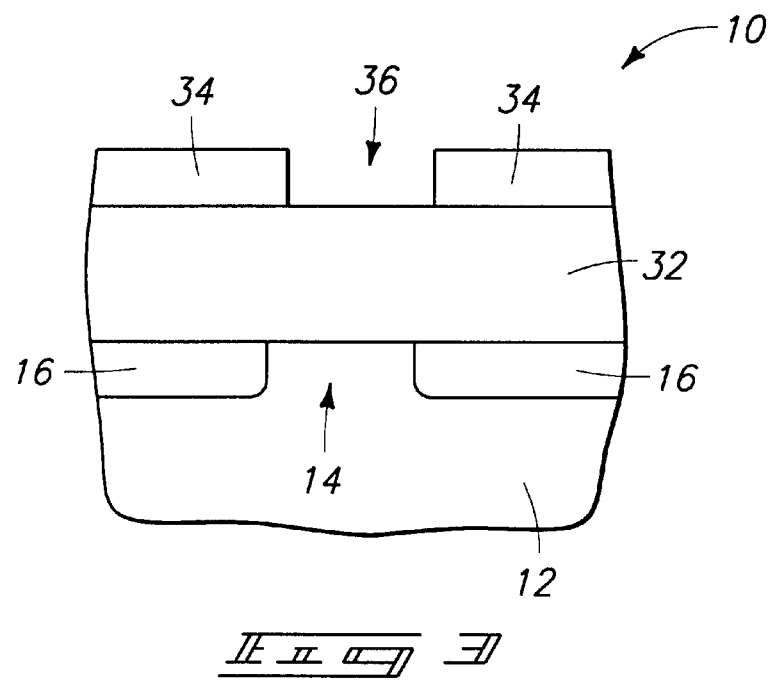
FIG. 3 is a cross-sectional view taken through line 3—3 in FIG. 1.

Referring to FIGS. 1–3, a semiconductor wafer fragment in process in accordance with an aspect of the invention is indicated generally with reference numeral 10. Such is comprised of a bulk semiconductor substrate, preferably monocrystalline silicon, having active areas 14 and undoped silicon dioxide comprising substrate isolation regions 16 formed therein. Accordingly, FIGS. 2 and 3 depict one active area 14 received between at least two undoped silicon dioxide comprising substrate isolation regions 16. Isolation regions 16 as shown comprise trench isolation regions. Alternate regions are of course contemplated, for example, and by way of example only, surface LOCOS regions.

At least two transistor gate constructions are received at least partially over one active area 14. FIGS. 1–3 depict four gate constructions 18a, 18b, 18c, and 18d. In the depicted example, each comprises a gate 20 composed of a conductively doped polysilicon region 22 and an overlying higher electrically conductive silicide region 24. A gate dielectric region 26 is received intermediate polysilicon region 22 and underlying active area 14 and/or isolation oxide 16. The sides and tops of gates 20 are covered with insulating material comprising at least one of undoped silicon dioxide and silicon nitride. Preferably as shown, the gate constructions comprise insulating material caps 28 patterned with fabrication of the underlying silicide and polysilicon. Further, such are shown to include anisotropically etched insulating material sidewall spacers 30. One or both or constructions 28 and 30 could comprise either of undoped silicon dioxide and/or silicon nitride. Considerable and significant yield improvements have been obtained where the insulating material of regions 28 and 30 is comprised of at least an outermost outer layer of silicon nitride, and preferably where such consists essentially of silicon nitride. As shown in the depicted embodiment in the illustrated FIG. 2 section, gate constructions 18a and 18d partially overlap an active area 14, while gate constructions 18b and 18c entirely overlap active area 14.

A doped silicon dioxide layer 32 is formed over and on active areas 14, isolation regions 16, and gate constructions 18. An example material is borophosphosilicate glass (BPSG) having weight concentrations of 4% boron and 6% phosphorous. Alternate examples include borosilicate glasses (BSG) and phosphosilicate glasses (PSG). Layer 32 has ideally been planarized and reflowed as shown.

A patterned masking layer 34 is formed over and on doped silicon dioxide layer 32. A preferred material for layer 34 is photoresist which has been patterned by photolithographic techniques to form the illustrated exemplary mask openings 36, 38 and 40. The discussion proceeds with respect to exemplary mask opening 36, which overlaps at least one of the gate constructions, and the two gate constructions 18a and 18b as shown, and active area 14. Further as exemplified in FIG. 3, the mask alignment has not been perfect such that opening 36 also overlaps the FIG. 3 right illustrated substrate isolation region 16.

Figure 4:
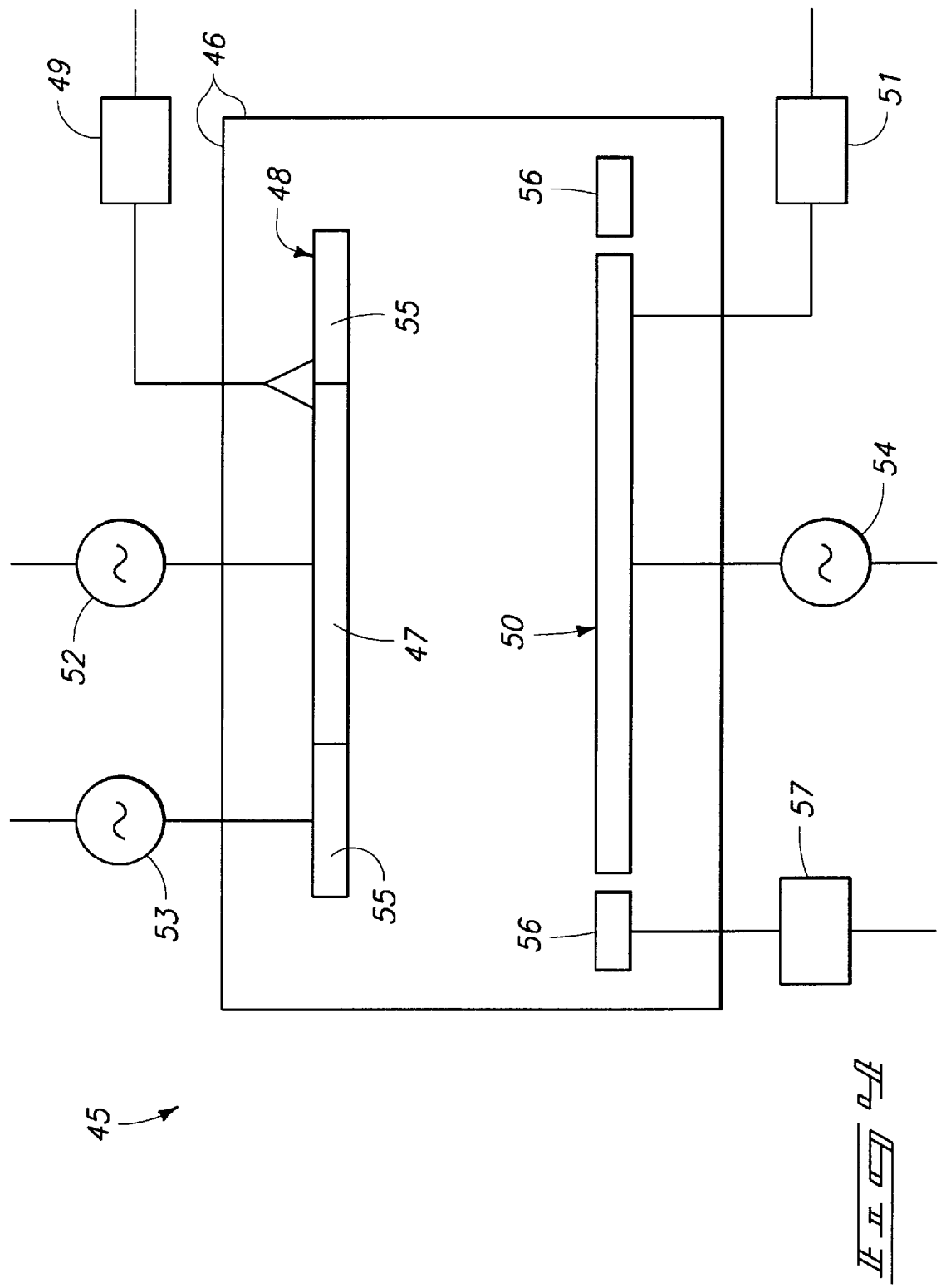
FIG. 4 is a diagrammatic schematic view of an exemplary high density plasma etcher utilizable in accordance with an aspect of the invention.

Substrate 10 is placed within a high density plasma etcher, for example the diagrammatically illustrated etcher 45 of FIG. 4. Such comprises chamber sidewalls 46, a top power electrode 48, and a bottom power electrode 50. Top electrode 48 comprises an inner component 47 and an outer component 55. Inner component 47 is powered by a suitable power supply 52, and outer component 55 is separately powered by a power supply 53. A power supply 54 powers bottom electrode 50.

Sidewalls 46 are not directly heated or cooled. Top power electrode 48 is directly heatable by a heater shown diagrammatically by box 49. Electrostatic chuck 50 upon which wafer 10 would lie is coolable by a suitable cooler shown at 51. In the context of this document, the term "directly" with respect to cooling or heating refers to a configuration whereby heating or cooling energy is provided to the respective component by an apparatus or mechanism which is associated therewith and at least in part dedicated for such purpose. By way of example only, examples include heating elements or fluid tubes within which a heating or cooling fluid would flow.

A plasma focus ring, 56 annularly surrounds electrostatic chuck 50 is directly heatable by a heater 57, typically upon which focus ring 56 rests. Alternate high density plasma etching tools are contemplated, with the invention only being limited by the accompanying claims appropriate interpreted in accordance with the Doctrine Of Equivalents. An example and the preferred reduction-to-practice reactor utilized in accordance with this invention is the Applied Materials IPS dielectric etcher.

Figure 5:
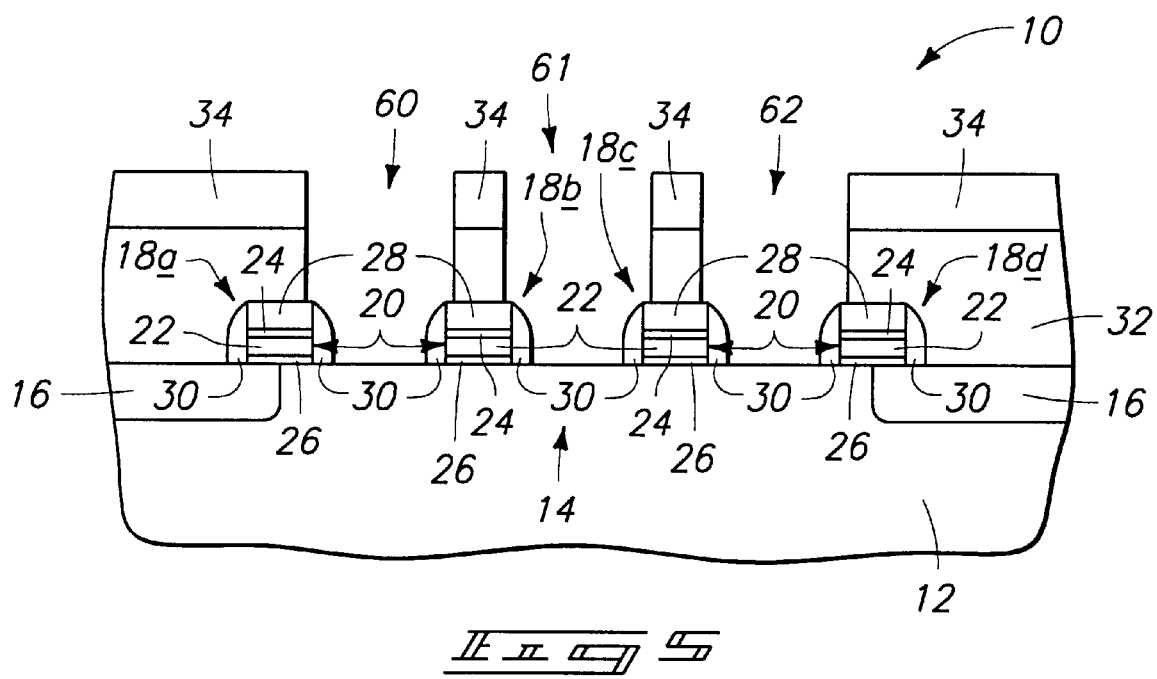
FIG. 5 is a view of the FIG. 2 wafer fragment at a processing step subsequent to that depicted by FIG. 2.
Figure 6:
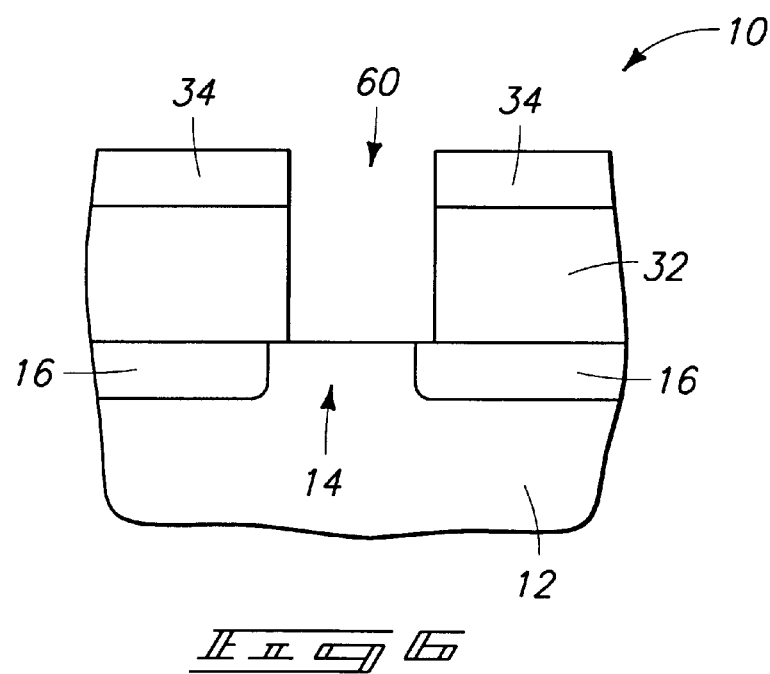
FIG. 6 is a sectional view corresponding in sequence to that of FIG. 5 as taken through line 3—3 in FIG. 1.

With wafer 10 positioned on electrostatic chuck 50, plasma etching is conducted through mask openings 36, 38 and 40 into doped oxide material 32 substantially selective to active area 14, insulating material 28/30, and any overlapped area of substrate isolation region 16 to form substantially self-aligned contact openings 60, 61 and 62 (FIGS. 5 and 6) to active area 14. In the context of the claims, "substantially selective" refers to an etch selectivity of at least 5:1 in relative material removal rate. Such etching is conducted using a hydrogen containing fluorocarbon chemistry. An example and preferred gas is $CHF_3$ at flow rates of from 5 sccm to 50 sccm and Ar at a flow rate of from 0 to 600 sccm. Other or additional gases can, of course, be used, with an example additional gas being $CF_4$ at an example preferred flow rate of 5 sccm to 100 sccm. A specific reduction-to-practice example in the Applied Materials IPS dielectric etcher included $CHF_3$ at 50 sccm, Ar at 350 sccm and $CF_4$ at 20 sccm. In the illustrated example, the FIG. 6 right isolation region is exposed by the plasma etching. Selectivity received relative to the undoped oxide region 16 exceeded 10:1.

Top electrode 48 is preferably heated to greater than 100° C. during the plasma etching and less than or equal to 300° C., and more preferably to from 200° C. to 250° C. Further preferably, electrostatic chuck 50 is preferably cooled to less than or equal to 40° C. during the plasma etching. Further, focus ring 56 is preferably heated during plasma etching to at least 200° C., and more preferably to between 250° C. and 350° C. Pressure during etching preferably ranges between 1 mTorr and 30 mTorr.

Top electrode 48 (total combined from components 47 and 55) is powered at less than or equal to 1000 W per 200 mm of substrate 10 diameter. Preferably, the outer component 55 is powered higher than inner component 47 to facilitate etch uniformity across the substrate. Further, electrostatic chuck 50 is bias powered to a suitable power less than the total top electrode power. Preferably, the electrostatic chuck is biased to within 300 W of the total top electrode power, and even more preferably within 200 W. Further preferably, the plasma etching is preferably conducted with the top electrode power being less than or equal to 800 W, and more preferably less than or equal to 700 W.

Operation in such parameter ranges has been discovered to achieve substantially improved etches of doped oxide substantially selective relative to undoped oxide, and thereby facilitate yield improvement in circuitry fabrication. A perceived belief of how such occurs is by operation of a high density plasma etcher in other than a regime where high density plasma is achieved. As used herein, "high density plasma" defines a plasma ion density greater than or equal to $10^9$ ions/cm$^3$. High density etchers of the prior art have been understood to be taught at use above 1000 W per 200-mm diameter wafer. Reduction of power density in accordance with the claimed invention has been found to achieve significant selectivity in an etch of doped silicon dioxide relative to undoped silicon dioxide. Such operating regimes are perceived to result in a plasma etching which is conducted below high density plasma, and even more preferably at or below a plasma density of $10^8$ ions/cm$^3$.

U.S. patent application Ser. No. 09/121,732 entitled "Method of Etching Doped Silicon Dioxide with Selectivity to Undoped Silicon Dioxide with a High Density Plasma Etcher", filed on Jul. 23, 1998, listing Kei-Yu Ko as an inventor, and U.S. patent application Ser. No. 08/846,671, entitled "Undoped Silicon Dioxide as an Etch Stop for Selective Etch of Doped Silicon Dioxide", filed Apr. 30, 1997, and listing Kei-Yu Ko as an inventor, are hereby incorporated by reference fully herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A self-aligned contact opening forming method comprising:
    providing a bulk semiconductor substrate having an active area received between at least two undoped silicon dioxide comprising substrate isolation regions, the substrate comprising at least two transistor gate constructions received at least partially over the active area, the gate constructions comprising gates having their sides and tops covered with insulating material comprising at least one of undoped silicon dioxide and silicon nitride;
    forming a doped silicon dioxide layer over the active area, the isolation regions and the gate constructions;
    forming a patterned masking layer over the doped silicon dioxide layer, the patterned masking layer having a mask opening formed therein which overlaps at least one of the gate constructions and the active area;
    placing the substrate within a high density plasma etcher; the etcher having a directly heatable top electrode comprising separately powerable inner and outer components, a biasable electrostatic chuck, and a directly heatable focus ring; and
    plasma etching through the mask opening, using a hydrogen containing fluorocarbon chemistry, power on both the inner and outer top electrode components which together totals less than or equal to 1000 W per 200 mm of substrate diameter, an electrostatic chuck bias power less than the total top electrode power, the top electrode heated to greater than 100° C. and the focus ring being heated to at least 200° C., into the doped oxide substantially selective to the active area, insulating material and any overlapped area of the substrate isolation regions to form a substantially self-aligned contact opening to the active area.

2. The method of claim 1 wherein the plasma etching is conducted with the top electrode power being less than or equal to 800 W.

3. The method of claim 1 wherein the plasma etching is conducted with the top electrode power being less than or equal to 700 W.

4. The method of claim 1 wherein the plasma etching is conducted with the electrostatic chuck being biased to no greater than 300 W lower than the total top electrode power.

5. The method of claim 1 wherein the plasma etching is conducted with the electrostatic chuck being biased to no greater than 200 W lower than the total top electrode power.

6. The method of claim 1 wherein the plasma etching is conducted with the top electrode being heated to less than or equal to 300° C.

7. The method of claim 1 wherein the plasma etching is conducted with the top electrode being heated at from about 200° C. to about 250° C.

8. The method of claim 1 wherein the plasma etching is conducted with the electrostatic chuck being cooled to 40° C. or less.

9. The method of claim 1 wherein the mask opening overlaps at least one of the substrate isolation regions, the one substrate isolation region being exposed during the plasma etching.

10. The method of claim 1 wherein the mask opening overlaps at least two of the transistor gate constructions.

11. The method of claim 1 wherein the insulating material of the gate constructions comprises at least an outermost outer layer of silicon nitride.

12. The method of claim 1 wherein the plasma etching is conducted at a pressure of no greater than 30 mTorr.

13. The method of claim 1 wherein the patterned masking layer comprises photoresist.

14. The method of claim 1 wherein the chemistry comprises $CHF_3$.

15. The method of claim 1 wherein the plasma etching is conducted at a plasma density below high density plasma.

16. The method of claim 15 wherein the plasma etching is conducted at a plasma density at or below $10^8$ ions/cm$^3$.

17. The method of claim 1 wherein the plasma etching is conducted at a plasma density below high density plasma using a chemistry comprising $CHF_3$ and Ar where the quantity of Ar exceeds that of $CHF_3$ by at least 5 times by volume.

18. The method of claim 17 wherein the plasma etching is conducted at a plasma density at or below $10^8$ ions/cm$^3$.

19. A self-aligned contact opening forming method comprising:
    providing a bulk semiconductor substrate having an active area received between at least two undoped silicon dioxide comprising substrate isolation regions, the substrate comprising at least two transistor gate constructions received at least partially over the active area, the gate constructions comprising gates having their sides and tops covered with insulating material comprising at least one of undoped silicon dioxide and silicon nitride;
    forming a doped silicon dioxide layer over the active area, the isolation regions and the gate constructions;
    forming a patterned masking layer over the doped silicon dioxide layer, the patterned masking layer having a mask opening formed therein which overlaps at least one of the gate constructions and the active area;
    placing the substrate within a high density plasma etcher; the etcher having a directly heatable top electrode comprising separately powerable inner and outer components, a biasable electrostatic chuck, and a directly heatable focus ring; and
    plasma etching through the mask opening, using a hydrogen containing fluorocarbon chemistry, power on both the inner and outer top electrode components which together totals less than or equal to 1000 W per 200 mm of substrate diameter, an electrostatic chuck bias power less than the top electrode power by no more than about 200 W, the top electrode heated to at least 100° C. and the focus ring being heated to at least 200° C., into the doped oxide substantially selective to the active area, insulating material and any overlapped area of the substrate isolation regions to form a substantially self-aligned contact opening to the active area.

20. The method of claim 19 wherein the plasma etching is conducted with the top electrode power being less than or equal to 800 W.

21. The method of claim 19 wherein the plasma etching is conducted with the top electrode power being less than or equal to 700 W.

22. The method of claim 19 wherein the plasma etching is conducted at a plasma density below high density plasma.

23. The method of claim 22 wherein the plasma etching is conducted at a plasma density at or below $10^8$ ions/cm$^3$.

24. The method of claim 19 wherein the plasma etching is conducted at a plasma density below high density plasma using a chemistry comprising CHF$_3$ and Ar where the quantity of Ar exceeds that of CHF$_3$ by at least 5 times by volume.

25. The method of claim 24 wherein the plasma etching is conducted at a plasma density at or below $10^8$ ions/cm$^3$.

26. A self-aligned contact opening forming method comprising:
    providing a bulk semiconductor substrate having an active area received between at least two undoped silicon dioxide comprising substrate isolation regions, the substrate comprising at least two transistor gate constructions received at least partially over the active area, the gate constructions comprising gates having their sides and tops covered with insulating material comprising at least one of undoped silicon dioxide and silicon nitride;
    forming a doped silicon dioxide layer over the active area, the isolation regions and the gate constructions;
    forming a patterned masking layer over the doped silicon dioxide layer, the patterned masking layer having a mask opening formed therein which overlaps at least one of the gate constructions and the active area;
    placing the substrate within a high density plasma etcher; the etcher having separately powerable inner and outer components and a biasable electrostatic chuck; and
    plasma etching through the mask opening, using a hydrogen containing fluorocarbon chemistry, power on both the inner and outer top electrode components which together totals less than or equal to 1000 W per 200 mm of substrate diameter, and an electrostatic chuck bias power less than the top electrode power by no greater than about 300 W, into the doped oxide substantially selective to the active area, insulating material and any overlapped area of the substrate isolation regions to form a substantially self-aligned contact opening to the active area.

27. The method of claim 26 wherein the plasma etching is conducted at a plasma density below high density plasma.

28. The method of claim 27 wherein the plasma etching is conducted at a plasma density at or below $10^8$ ions/cm$^3$.

29. The method of claim 26 wherein the plasma etching is conducted at a plasma density below high density plasma using a chemistry comprising CHF$_3$ and Ar where the quantity of Ar exceeds that of CHF$_3$ by at least 5 times by volume.

30. The method of claim 29 wherein the plasma etching is conducted at a plasma density at or below $10^8$ ions/cm$^3$.

31. A self-aligned contact opening forming method comprising:
    providing a substrate having at least two electronic device constructions at least partially covered with insulating material comprising at least one of undoped silicon dioxide and silicon nitride;
    forming a doped silicon dioxide layer over the at least two electronic device constructions;
    forming a patterned masking layer over the doped silicon dioxide layer, the patterned masking layer having a mask opening formed therein which overlaps the insulating material;
    placing the substrate within a high density plasma etcher; the etcher having a directly heatable top electrode comprising separately powerable inner and outer components, a biasable electrostatic chuck, and a directly heatable focus ring; and
    plasma etching through the mask opening, using a hydrogen containing fluorocarbon chemistry, power on both the inner and outer top electrode componenets which together totals less than or equal to 1000 W per 200 mm of substrate diameter, an electrostatic chuck bias power less than the total top electrode power, the top electrode heated to greater than 100° C. and the focus ring being heated to at least 200° C., into the doped oxide substantially selective to the insulating material to form a substantially self-aligned contact opening to a substrate location beneath the doped silicon dioxide layer.

32. The method of claim 31 wherein the plasma etching is conducted with the top electrode power being less than or equal to 800 W.

33. The method of claim 31 wherein the plasma etching is conducted with the top electrode power being less than or equal to 700 W.

34. The method of claim 31 wherein the plasma etching is conducted with the electrostatic chuck being biased to no greater than 300 W lower than the total top electrode power.

35. The method of claim 31 wherein the plasma etching is conducted with the electrostatic chuck being biased to no greater than 200 W lower than the total top electrode power.

36. The method of claim 31 wherein the plasma etching is conducted with the top electrode being heated to less than or equal to 300° C.

37. The method of claim 31 wherein the plasma etching is conducted with the top electrode being heated at from about 200° C. to about 250° C.

38. The method of claim 31 wherein the plasma etching is conducted with the electrostatic chuck being cooled to 40° C. or less.

39. The method of claim 31 wherein the mask opening overlaps at least one of the substrate isolation regions, the one substrate isolation region being exposed during the plasma etching.

40. The method of claim 31 wherein the mask opening overlaps at least two of the transistor gate constructions.

41. The method of claim 31 wherein the insulating material of the gate constructions comprises at least an outermost outer layer of silicon nitride.

42. The method of claim 31 wherein the plasma etching is conducted at a pressure of no greater than 30 mTorr.

43. The method of claim 31 wherein the patterned masking layer comprises photoresist.

44. The method of claim 31 wherein the chemistry comprises CHF$_3$.

45. The method of claim 31 wherein the plasma etching is conducted at a plasma density below high density plasma.

46. The method of claim 45 wherein the plasma etching is conducted at a plasma density at or below $10^8$ ions/cm$^3$.

47. The method of claim 31 wherein the plasma etching is conducted at a plasma density below high density plasma using a chemistry comprising CHF$_3$ and Ar where the quantity of Ar exceeds that of CHF$_3$ by at least 5 times by volume.

48. The method of claim 47 wherein the plasma etching is conducted at a plasma density at or below $10^8$ ions/cm$^3$.

49. A self-aligned contact opening forming method comprising:

providing a substrate comprising at least two electronic device constructions at least partially covered with insulating material comprising at least one of undoped silicon dioxide and silicon nitride;

forming a doped silicon dioxide layer over the at least two electronic device constructions;

forming a patterned masking layer over the doped silicon dioxide layer, the patterned masking layer having a mask opening formed therein which overlaps the insulating material;

placing the substrate within a highly density plasma etcher; the etcher having a directly heatable top electrode comprising separately powerable inner and outer components, a biasable electrostatic chuck, and a directly heatable focus ring; and plasma etching through the mask opening, using a hydrogen containing fluorocarbon chemistry, power on both the inner and outer top electrode componenets which together totals less than or equal to 1000 W per 200 mm of substrate diameter, an electrostatic chuck bias power less than the top electrode power by no more than about 200 W, the top electrode heated to at least 100° C. and the focus ring being heated to at least 200° C., into the doped oxide substantially selective to the insulating material to form a substantially self-aligned contact opening to a substrate location beneath the doped silicon dioxide layer.

50. The method of claim 49 wherein the plasma etching is conducted with the top electrode power being less than or equal to 800 W.

51. The method of claim 49 wherein the plasma etching is conducted with the top electrode power being less than or equal to 700 W.

52. The method of claim 49 wherein the plasma etching is conducted at a plasma density below high density plasma.

53. The method of claim 52 wherein the plasma etching is conducted at a plasma density at or below $10^8$ ions/cm$^3$.

54. The method of claim 49 wherein the plasma etching is conducted at a plasma density below high density plasma using a chemistry comprising CHF$_3$ and Ar where the quantity of Ar exceeds that of CHF$_3$ by at least 5 times by volume.

55. The method of claim 54 wherein the plasma etching is conducted at a plasma density at or below $10^8$ ions/cm$^3$.

56. A self-aligned contact opening forming method comprising:

providing a substrate having at least two electronic device constructions at least partially covered with insulating material comprising at least one of undoped silicon dioxide and silicon nitride;

forming a doped silicon dioxide layer over the at least two electronic device constructions;

forming a patterned masking layer over the doped silicon dioxide layer, the patterned masking layer having a mask opening formed therein which overlaps the insulating material;

placing the substrate within a high density plasma etcher; the etcher having separately powerable inner and outer components, a biasable electrostatic chuck; and plasma etching through the mask opening, using a hydrogen containing fluorocarbon chemistry, power on both the inner and outer top electrode componenets which together totals less than or equal to 1000 W per 200 mm of substrate diameter, and an electrostatic chuck bias power less than the top electrode power by no greater than about 300 W, into the doped oxide substantially selective to the insulating material to form a substantially self-aligned contact opening to a substrate location beneath the doped silicon dioxide layer.

57. The method of claim 56 wherein the plasma etching is conducted at a plasma density below high density plasma.

58. The method of claim 57 wherein the plasma etching is conducted at a plasma density at or below $10^8$ ions/cm$^3$.

59. The method of claim 56 wherein the plasma etching is conducted at a plasma density below high density plasma using a chemistry comprising CHF$_3$ and Ar where the quantity of Ar exceeds that of CHF$_3$ by at least 5 times by volume.

60. The method of claim 59 wherein the plasma etching is conducted at a plasma density at or below $10^8$ ions/cm$^3$.

* * * * *

UNITED STATES PATENT AND TRADEMARK OFFICE
CERTIFICATE OF CORRECTION

PATENT NO.    : 6,432,833 B1
DATED         : August 13, 2002
INVENTOR(S)   : Kei-Yu Ko It is certified that error appears in the above-identified patent and that said Letters Patent is hereby corrected as shown below:

Column 1,
Line 39, replace "a contact opening inadvertently or desirably" with -- a contact opening inadvertently or undesirably --

Column 3,
Line 21, replace "sidewall spacers 30. One or both or" with -- sidewall spacers 30. One or both of --

Column 4,
Line 6, replace "chuck 50 is directly heatable by a heater 57," with -- chuck 50. Such is directly heatable by a heater 57, --
Line 9, replace "limited by the accompanying claims appropriate" with -- limited by the accompanying claims appropriately --
Line 25, replace "50 sccm and Ar at a flow rate of from 0 to" with -- 50 sccm and Ar at a flow rate of from 0 sccm to --

Cooumn 8,
Line 16, replace "and outer top electrode componenets" with -- and outer top electrode components --

Column 9,
Line 11, replace "and outer top electrode componenets" with -- and outer top electrode components --

Column 10,
Line 23, replace "and outer top electrode componenets" with -- and outer top electrode components --

Signed and Sealed this

Eleventh Day of March, 2003

JAMES E. ROGAN
*Director of the United States Patent and Trademark Office*